(12) United States Patent
Chiou et al.

(10) Patent No.: US 6,809,130 B2
(45) Date of Patent: Oct. 26, 2004

(54) HALOGEN-FREE, PHOSPHORUS-FREE FLAME-RETARDANT ADVANCED EPOXY RESIN AND AN EPOXY COMPOSITION CONTAINING THE SAME

(75) Inventors: Kuo-Chan Chiou, Hsinchu (TW); Tzong-Ming Lee, Hsinchu (TW); Feng-Po Tseng, Hsinchu (TW); Lu-Shih Liao, Hsinchu (TW); Jia-Chi Huang, Hsinchu (TW); Tzu-Ting Lin, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 36 days.

(21) Appl. No.: 10/384,752

(22) Filed: Mar. 11, 2003

(65) Prior Publication Data

US 2004/0110874 A1 Jun. 10, 2004

(30) Foreign Application Priority Data

Dec. 6, 2002 (TW) .......................... 91135494

(51) Int. Cl.$^7$ ............................ C08K 3/36; C08L 63/02
(52) U.S. Cl. ...................... 523/443; 523/457; 523/458; 525/423; 525/488; 525/523; 525/533; 528/113; 528/117; 528/123; 528/124; 528/407; 549/543; 549/551; 549/555
(58) Field of Search .................. 523/443, 457, 523/458; 528/113, 117, 123, 124, 407; 525/423, 488, 523, 533; 549/543, 551, 555

(56) References Cited

FOREIGN PATENT DOCUMENTS

JP          5179220       * 12/1991

OTHER PUBLICATIONS

Abstract of Japanese Pat. JP5179220, Derwent, 1993.*

* cited by examiner

*Primary Examiner*—Philip Tucker
*Assistant Examiner*—D. Aylward
(74) *Attorney, Agent, or Firm*—Bacon & Thomas PLLC

(57) ABSTRACT

A halogen-free, phosphorus-free poly-cyclic compound is used a flame retardant. This compound has amide and hydroxy groups, and thus it is able to react with an epoxy resin to form a reactive type flame-retardant advanced epoxy resin. The advanced epoxy resin together with an inorganic additive are mixed with an epoxy resin to form a halogen-free, phosphorus-free flame-retardant epoxy composition, which can be used in the manufacture of a printed circuit board and as an encapsulation material for a semi-conductor device.

11 Claims, No Drawings

HALOGEN-FREE, PHOSPHORUS-FREE FLAME-RETARDANT ADVANCED EPOXY RESIN AND AN EPOXY COMPOSITION CONTAINING THE SAME

FIELD OF THE INVENTION

The present invention relates generally to halogen-free, phosphorus-free flame-retardant epoxy resins suitable for use in making printed circuit boards and in semiconductor encapsulation applications.

BACKGROUND OF THE INVENTION

Epoxy resins have the excellent characteristics of moisture, solvent and chemical resistance, toughness, low shrinkage on cure, superior electrical and mechanical resistance properties, and good adhesion to many substrates. The versatility in formulation also make epoxy resins widely applicable industrially for surface coatings, adhesive, painting materials, potting, composites, laminates, encapsulants for semiconductors, and insulating materials for electric devices, etc. o-Cresol formaldehyde novolac epoxy (CNE) is the resin typically employed in the encapsulation of microelectronic devices. Several approaches for modification of epoxy backbone for enhancing the thermal properties of epoxy resins have been reported. Aromatic bromine compounds in conjunction with antimony oxide are widely used as a flame retardant for epoxy resins. Tetrabromobisphenol A is a typical example of the aromatic bromine compounds used as a flame retardant for epoxy resins. An excess amount of epoxy resin is reacted with tetrabromobisphenol A to prepare an advanced epoxy resin having two terminal epoxide groups, as shown in the following formula:

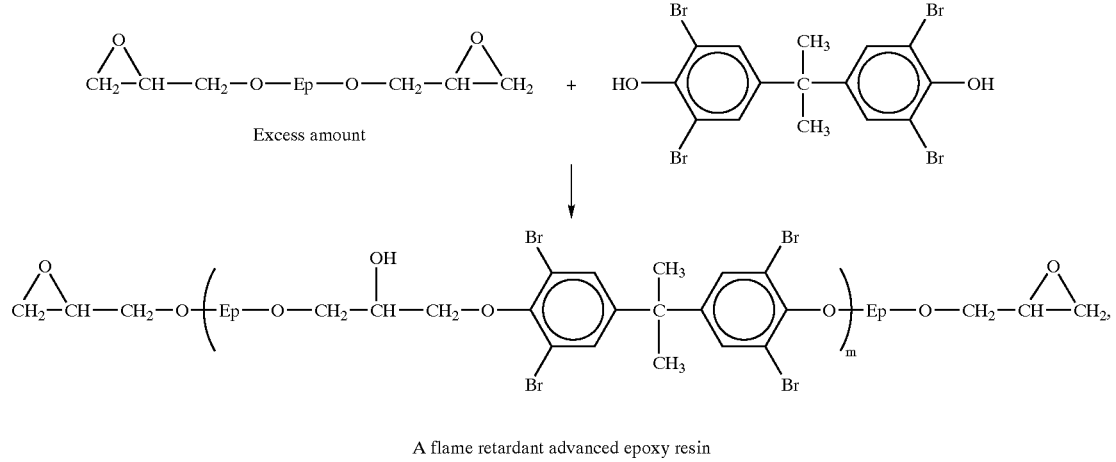

A flame retardant advanced epoxy resin wherein EP is a bi-radical group of the backbone of the epoxy resin, and m is an integer of 1–10. The advanced epoxy resin can be used in preparing a flame-retardant printed circuit board (FR-4) by impregnating glass fibers with the advanced epoxy resin and heating the resulting composite to cure the advanced epoxy resin. Furthermore, the advanced epoxy resin can be employed to encapsulate microelectronic devices, in which the advanced epoxy resin is cured at a high temperature with a curing agent, so that an encapsulant having a flame-retardant property is formed.

Although the tetrabromobisphenol A-containing advanced epoxy resin shows flame retardant property, major problems encountered with this system are concerned with the generation of toxic and corrosive fumes during combustion such as dioxin and benzofuran.

The flame retardant having a small molecular weight tends to degrade the mechanical properties of the epoxy resins, and migrate/vaporize from the epoxy resins such that the flame retardancy thereof diminishes.

Owing to organic phosphorus compounds generate less toxic gas and smoke than halogen-containing compounds, some authors have reported advanced epoxy resins containing phosphorus compound, for examples U.S. Pat. Nos. 6,291,626; 6,291,627; and JP 2001-220427.

Although phosphorus-containing flame retardants can replace the conventional halogen-containing flame retardants in the aspect of flame retardancy, the phosphorus-containing flame retardants inevitably cause the eutrophication in rivers and lakes after hydrolysis, and create environmental problems. Further, their high absorbency of moisture leads to decomposition, and thus will jeopardizes the long time reliability of a semiconductor product. Therefore, there is a need in the semiconductor product encapsulation industry for developing a halogen-free, phosphorus-free flame-retardant epoxy resin.

SUMMARY OF THE INVENTION

The invention of the present application provide a halogen-free, phosphorus-free flame-retardant advanced epoxy resin, and epoxy composition. They are suitable for use in the fabrication of printed circuit boards and as an encapsulation material for semiconductor products.

The halogen-free, phosphorus-free flame-retardant advanced epoxy resin synthesized according to the present invention has the following formula (I):

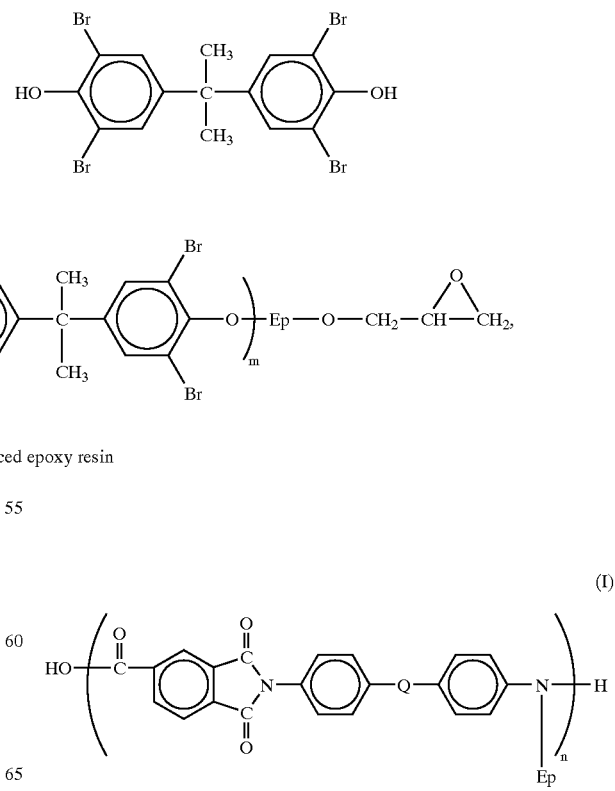

wherein Q is

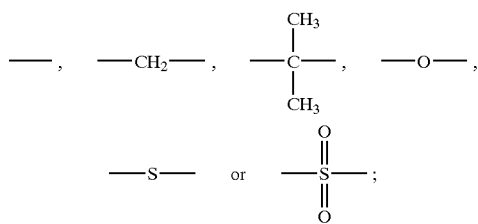

$0 < n < 60$; and
Ep is

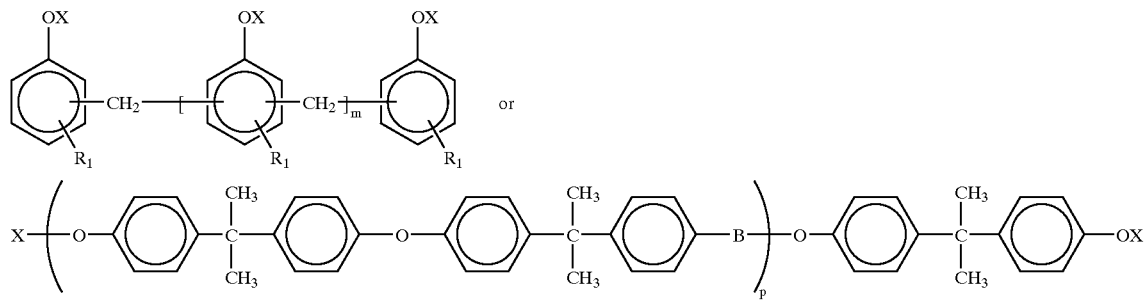

wherein $0 < m < 12$; $0 < p < 12$; $R_1$ is hydrogen or methyl; and $X = A$ or $B$, and at least one of X is B, wherein

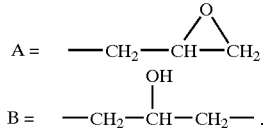

The halogen-free, phosphorus-free flame-retardant epoxy composition disclosed in the present invention comprises 10~50 wt % of an epoxy resin having two or more epoxide functionalities; 10~40 wt % of an inorganic filler; and 20~80 wt % of the advanced epoxy resin (I).

Preferably, Q in the formula (I) is methylene.

DETAILED DESCRIPTION OF THE INVENTION

The present invention discloses the use of a halogen-free, phosphorus-free poly-cyclic compound having a high nitrogen content as a flame retardant. The ploy-cyclic compound has an amide and hydroxyl functional groups, and the amide functional group is able to react with an epoxy resin to form a reactive advanced epoxy resin. An environmentally friendly halogen-free, phosphorus-free, flame-retardant epoxy composition can then be prepared by mixing the reactive advanced epoxy resin and an inorganic filler with a matrix epoxy resin, which is suitable for use in the fabrication of printed circuit boards and as an encapsulation material for semiconductor products. The flame retardant of the present invention further has an imide group to impart a superior high-temperature stability and mechanical properties to the resultant environmentally friendly flame-retardant epoxy composition prepared. A further advantage of the environmentally friendly flame-retardant epoxy composition is its high compatibility with the current fabrication process of the printed circuit boards, so that it can be readily applied in the fabrication process without making significant changes to the fabrication process and apparatus.

According to one of the preferred embodiments of the present invention a reactive flame-retardant advanced epoxy resin was prepared by reacting a flame retardant having the following formula (II) with an epoxy resin having the following formula (III):

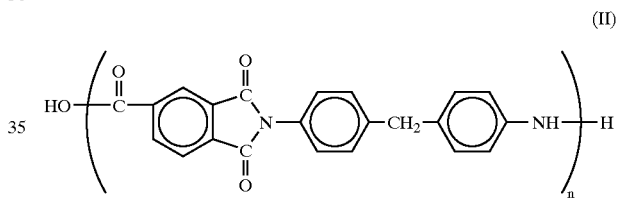

(II)

wherein n is defined as above;

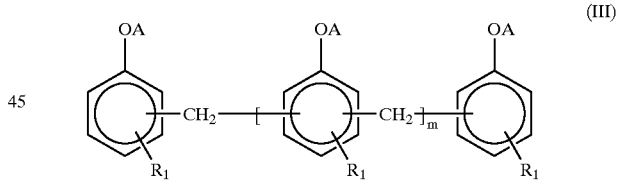

(III)

wherein A, $R_1$ and m are defined as above.

The resulting reactive flame retardant advanced epoxy resin has the following structure:

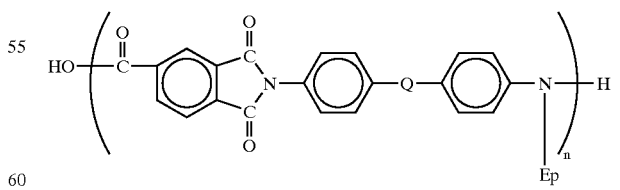

Wherein n and Ep are defined as above.

Preferably, the epoxy resin having the formula (III) is cresol novolac epoxy resin.

The environmentally friendly halogen-free, phosphorus-free, flame-retardant epoxy resin composition of the present invention comprises 10~50 wt % of a matrix epoxy resin having two or more epoxide functionalities; 10~40 wt % of an inorganic filler; and 20~80 wt % of the reactive advanced epoxy resin.

Preferably, said inorganic filler is selected from the group consisting of $SiO_2$, $TiO_2$, $Al_2O_3$, $Al(OH)_3$, $Mg(OH)_2$, and $CaCO_3$, and is in the powder form having an average grain size of 0.01~5 μm.

Preferably, said matrix epoxy resin having two or more epoxide functionalities has an epoxide equivalent weight of 150~1,000, for example the novolac epoxy resin (III) and the following diglycidyl ether:

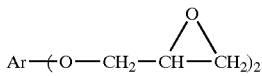

wherein Ar is

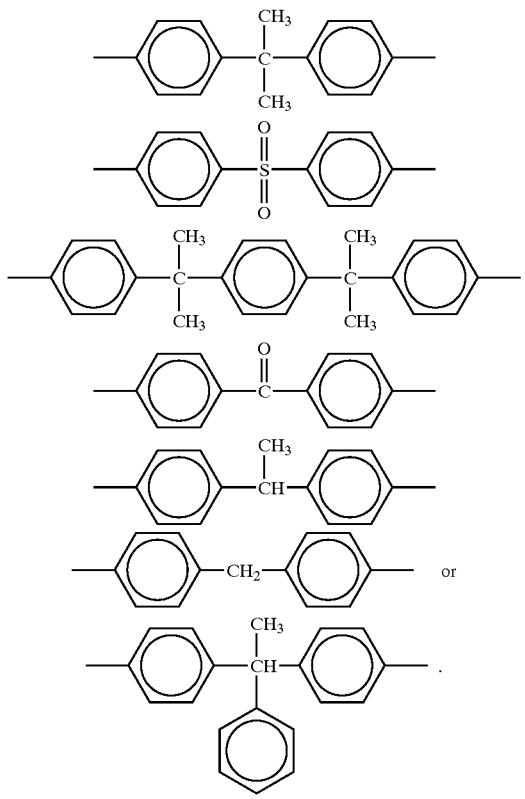

Example 1

To a 2 L, four-neck glass reactor equipped with a 3-blade stirrer, 41.8 g of cresol novolak epoxy resin having an epoxide equivalent weight of 200–230 (Code: 703, NAN-YA PLASTIC Co., Taiwan), 109.8 g of the flame retardant having the formula (II) (Code: AI-27, molecular weight 18,000–20,000, FU-PAO CHEMICAL Co., Taiwan) and 48.4 g of a solvent, propylene glycol monomethyl ether acetate (abbreviated as PMA) were added, and the mixture was heated at 120° C. while stirring for one hour to form a reactive flame retardant advanced epoxy resin. The temperature was cooled to room temperature, and 72.9 g of diglycidyl ether of bisphenol A epoxy resin (abbreviated as DGEBA) having an epoxide equivalent weight of 184–190 (Code: 128E, NAN-YA PLASTIC Co., Taiwan), 137.9 g of $Al(OH)_3$ and 7.9 g of PMA solvent were added and well stirred to obtain a halogen-free, phosphorus-free, flame-retardant epoxy resin composition.

Example 2

The procedures for preparing the reactive advanced epoxy resin in Example 1 were repeated. The temperature of the reactive flame retardant advanced epoxy resin was cooled from 120° C. to 100° C., and 72.9 g of cresol novolak epoxy resin (Code: 703) was added and dissolved. The temperature was cooled to 100° C., and 137.9 g of $Al(OH)_3$ and 7.9 g of PMA solvent were added and well stirred to obtain a halogen-free, phosphorus-free, flame-retardant epoxy resin composition.

Example 3

The procedures of Examples 2 were repeated to obtain a halogen-free, phosphorus-free, flame-retardant epoxy resin composition, except that 4.9 g of DGEBA epoxy resin (Code: 128E) was added together with the addition of $Al(OH)_3$ and PMA.

Control 1

The procedures of Examples 1 were repeated to obtain a halogen-free, phosphorus-free epoxy resin composition, except that the cresol novolak epoxy resin (Code: 703) used in the preparation of the reactive advanced epoxy resin was replaced by DGEBA epoxy resin (Code: 128E).

Control 2

The procedures of Examples 2 were repeated to obtain a halogen-free, phosphorus-free epoxy resin composition, except that the cresol novolak epoxy resin (Code: 703) used in the preparation of the reactive advanced epoxy resin was replaced by DGEBA epoxy resin (Code: 128E).

Control 3

The procedures of Examples 3 were repeated to obtain a halogen-free, phosphorus-free epoxy resin composition, except that the cresol novolak epoxy resin (Code: 703) used in the preparation of the reactive advanced epoxy resin was replaced by DGEBA epoxy resin (Code: 128E).

The following Table 1 lists the formulations of the epoxy resin compositions prepared in Examples 1–3 and Controls 1–3, and Table 2 shows their retardant properties.

TABLE 1

| | Advanced epoxy resin | | | | Epoxy composition | | | |
|---|---|---|---|---|---|---|---|---|
| | 703 | 128E | FR | PMA | 703 | 128E | $Al(OH)_3$ | PMA |
| Example 1 | 41.8 | — | 109.8 | 48.4 | — | 72.9 | 137.9 | 7.9 |
| Example 2 | 41.8 | — | 109.8 | 48.4 | 72.9 | — | 137.9 | 7.9 |
| Example 3 | 41.8 | — | 109.8 | 48.4 | 72.9 | 4.9 | 137.9 | 7.9 |
| Control 1 | — | 41.8 | 109.8 | 48.4 | — | 72.9 | 137.9 | 7.9 |
| Control 2 | — | 41.8 | 109.8 | 48.4 | 72.9 | — | 137.9 | 7.9 |
| Control 3 | — | 41.8 | 109.8 | 48.4 | 72.9 | 4.9 | 137.9 | 7.9 |

TABLE 2

| | Tg (° C.) | CTE* (ppm/° C.) | UL 94 |
|---|---|---|---|
| Example 1 | 210 | 78.2 | V1 |
| Example 2 | 219 | 67 | V0 |
| Example 3 | 205 | 70.2 | V0 |
| Control 1 | 223 | 82.4 | V2 |
| Control 2 | 214 | 68.5 | V1 |
| Control 3 | 218 | 73.2 | V1 |

*CTE is coefficient of thermal expansion

What is claimed is:

1. A halogen-free, phosphorus-free flame-retardant advanced epoxy resin having the following formula (I):

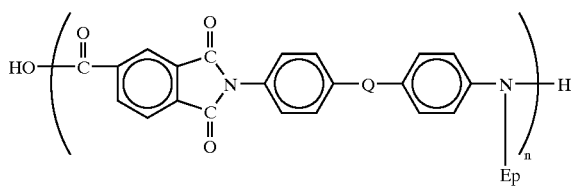

wherein Q is

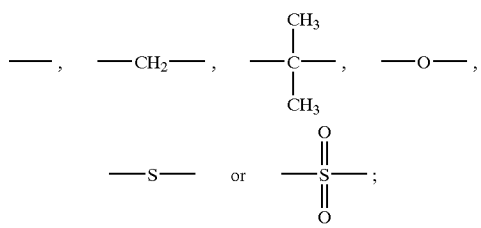

$0<n<60$; and
Ep is

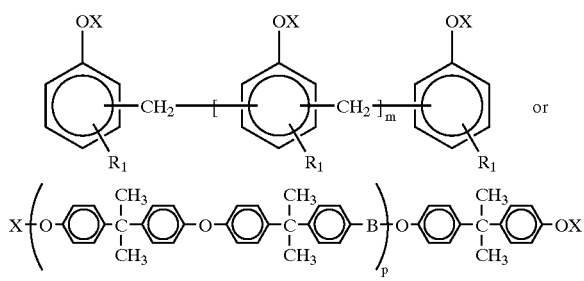

wherein $0<m<12$; $0<p<12$; $R_1$ is hydrogen or methyl; and X=A or B and at least one of X is B, wherein

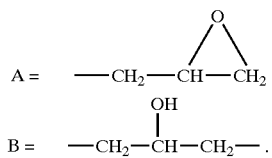

2. The advanced epoxy resin of claim 1, wherein Q in the formula (I) is methylene.

3. The advanced epoxy resin of claim 1, wherein $R_1$ is methyl.

4. The advanced epoxy resin of claim 1 prepared by reacting a flame retardant having the following formula (II) with an epoxy resin having the following formula (III):

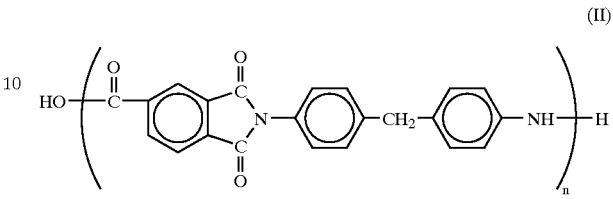

wherein n is defined as in claim 1;

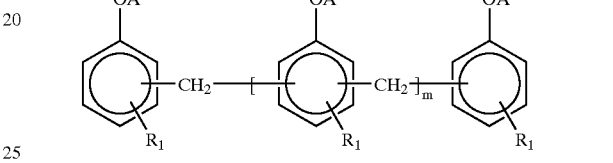

wherein A, $R_1$ and m are defined as in claim 1.

5. The advanced epoxy resin of claim 4, wherein Q in the formula (II) is methylene.

6. The advanced epoxy resin of claim 4, wherein said epoxy resin having the formula (III) is cresol novolac epoxy resin.

7. A halogen-free, phosphorus-free flame-retardant epoxy composition comprising 10~50 wt % of an epoxy resin having two or more epoxide functionalities; 10~40 wt % of an inorganic filler; and 20~80 wt % of the advanced epoxy resin (I) defined in claim 1.

8. The epoxy resin composition of claim 7, wherein Q in the formula (I) is methylene.

9. The epoxy resin composition of claim 7, wherein $R_1$ is methyl.

10. The epoxy resin composition of claim 7, wherein said epoxy resin having two or more epoxide functionalities has an epoxide equivalent weight of 150~1,000.

11. The epoxy resin composition of claim 7, wherein said inorganic filler is selected from the group consisting of $SiO_2$, $TiO_2$, $Al_2O_3$, $Al(OH)_3$, $Mg(OH)_2$, and $CaCO_3$, and is in the powder form having an average grain size of 0.01~5 µm.

* * * * *